United States Patent [19]

DeSantis

[11] 4,334,187
[45] Jun. 8, 1982

[54] PHASE SENSOR FOR R.F. TRANSMISSION LINES

[75] Inventor: Charles M. DeSantis, Neptune, N.J.

[73] Assignee: The United States of America as represented by the Secretary of the Army, Washington, D.C.

[21] Appl. No.: 186,109

[22] Filed: Sep. 11, 1980

[51] Int. Cl.³ .............................................. G01R 27/04
[52] U.S. Cl. ................................. 324/58 R; 324/84; 324/126
[58] Field of Search .................. 324/58 R, 84, 95, 126, 324/58 B, 133

[56] References Cited

U.S. PATENT DOCUMENTS

| | | | |
|---|---|---|---|
| 2,442,606 | 6/1948 | Korman | 324/84 |
| 4,262,246 | 4/1981 | Fujii | 324/58 R |

FOREIGN PATENT DOCUMENTS

| | | | |
|---|---|---|---|
| 1103459 | 3/1961 | Fed. Rep. of Germany | 324/58 R |
| 144609 | 10/1980 | German Democratic Rep. | 324/58 B |

*Primary Examiner*—Stanley T. Krawczewicz
*Attorney, Agent, or Firm*—Nathan Edelberg; Jeremiah G. Murray; John W. Redman

[57] ABSTRACT

A phase sensing device is described which is useful for indicating the resonance condition of a complex load impedance (such as an antenna), with a high degree of accuracy over the frequency range from 3 to 100 MHz. The device uses readily available transmission line and solid state components to provide a ± indication of the phase condition of the load; a zero crossing indicates resonance. Such a signal is useful for controlling an automatic turning mechanism that could be used in a tunable antenna. The extremely broadband operation and no physical connection to the main RF line are salient features of the device. The components are a transmission line coupler with a short pick-up wire mounted adjacent to the center conductor, two diodes with like electrodes (cathodes) connected to opposite ends of the pick-up wire, a carbon resistor between the other electrodes of the diodes, and a zero center meter across the resistor.

2 Claims, 2 Drawing Figures

PHASE SENSOR FOR R.F. TRANSMISSION LINES

The invention described herein may be manufactured, used, and licensed by or for the Government for governmental purposes without the payment to me of any royalties thereon.

BACKGROUND OF THE INVENTION

This invention relates to a device for detecting the phase on an R.F. transmission line, which is useful for indicating the resonance condition of a complex load impedance (such as an antenna).

Various types of phase detectors, SWR indicators, forward and reflect power measuring devices, etc., have been known for many years. These devices are coupled into the transmission line, often between a transmitter and an antenna tuner. A Phase-Angle Detector for R.F. Transmission Lines is described in QST, July 1952, pages 17-20. However, that and most (if not all) other circuits to date use some form of wire-wound transformer to generate the vector voltages necessary for a phase indication, and that transformer can be the greatest source of problems in the design of a wide band instrument. Assymetry problems, spurious resonances, and non-linear response (due to the core material) are some of the most critical areas in transformer design.

Other prior art of interest includes the "Millimatch", a Matching Indicator for Low Power described in the A.R.R.L. Handbook, 1973 edition, pages 533-535, for giving a relative indication of forward and reflected power; U.S. Pat. No. 3,922,679 for a Wide Band Radio Frequency Phase Sensor; and my U.S. Pat. No. 4,071,819 for a Device for Sensing the Real Part in a Complex Impedance.

SUMMARY OF THE INVENTION

The object of the invention is to provide a simple, easily constructed phase detector using conventional components which is effective over a very broad frequency range.

The device according to the invention does not require any physical connection to the mainline of the R.F. transmission system, nor any wire-wound transformer. Coupling is obtained by a short length of wire parallel and adjacent to the center conductor of the main line. The circuit comprises two diodes connected with like poles to opposite ends of the coupling wire, a resistor between the other poles of the diodes, and a meter across the resistor.

The sensor has extremely broadband operation.

DETAILED DESCRIPTION

Figure 1:
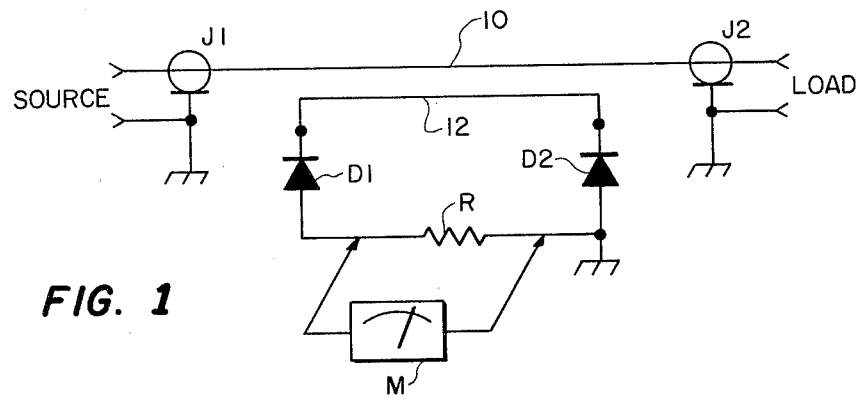
FIG. 1 is a schematic diagram of a phase sensor circuit.

FIG. 1 is a schematic diagram of a phase sensor circuit. It comprises a transmission line coupler section connected via coax connector J1 to an R.F. source, and via coax connector J2 to a complex adjustable load impedance. For example, the source may be a transmitter, and the load may comprise a tuner coupled via a transmission line to an antenna. The particular connection of the diodes was found to give a zero crossing indication. Investigation of the impedance values of the complex adjustable load impedance revealed that this zero crossing signal gives an indication of the phase of the load. The results showed that the zero crossing condition occurred whenever the load impedance went through resonance (by varying the adjustable elements of the load); and furthermore, the indication was reliable over a frequency range from 3 to 100 megahertz.

Examine the circuit of FIG. 1 in its simplicity. Two diodes D1 and D2 (preferably matched, such as type 1N276) a 120-kilohm, ½ watt carbon resistor R, and a bi-directional transmission line coupler—all common components—are combined to form an extremely wide band phase indicator.

Figure 2:
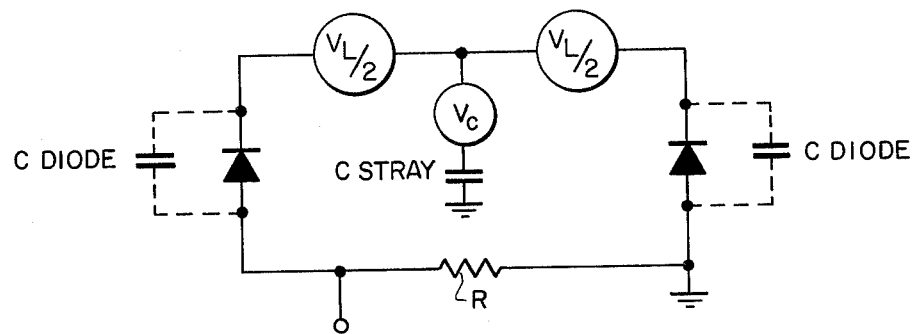
FIG. 2 is a suggested equivalent circuit.

To give a simplified theory of operation, a suggested equivalent circuit is shown in FIG. 2. The voltages $V_L$ are proportional to the current flowing in the mainline of the coupler, while the voltage $V_C$ is proportional to the mainline voltage. Since the transmission line coupler is very short compared to a wavelength in the range from 3 to 100 MHz, the sampled voltage is essentially proportional to the input and output voltages on the line, which are almost identical. Regarding the further operation of the device, reference is made to the QST article (July 1952, pp 17-18) where an adequate description is provided and is directly applicable when studied in conjunction with the equivalant circuit of FIG. 2.

The transmission line coupler was constructed from available parts and material and follows conventional coupler design. Many versions of transmission line couplers can be adapted for use in this device. The key point which it appears gives the ultrawide band operation is the use of transmission line techniques, negating the need for core materials, coil-winding, and Faraday shielding usually necessary in more conventional transformer construction.

The coupler used is like that described in the Radio Amateur's Handbook, A.R.R.L., 1973 edition, pp 533-535. It is mounted in a small metal box. The transmission line section consists of an inner condutor (a piece of ¼ inch O.D. copper tubing 4⅝ inches long) and two pieces of flashing copper for the outer conductor. Separation between the copper strips and inner conductor is maintained by two insulated spacers, which may for example, be material of reasonably low loss, such as is sold under the trademarks TEFLON OR BAKELITE. There are two small slots on opposite sides of these insulating spacer blocks for mounting two pick-up wires, which are 3⅜ inch lengths of No. 14 tinned wire. In the phase sensor circuit of FIG. 1, one of the coupling arms was removed. The remaining transmission line coupler comprises the inner conductor 10 and the single pick-up wire 12. The two diodes D1 and D2 have their cathode electrodes soldered to the opposite ends of wire 12. The resistor R is connected between the anode electrodes of the diodes. The millivoltmeter M is connected across the resistor R. The meter should be a zero-center reading type; i.e., a meter showing plus or minus indication such as a galvanometer. With such an indicator the resonant condition (zero crossing) is easily seen, and an indication of the impedance state of the antenna (away from resonance) is also given.

What is claimed is:

1. A phase sensor circuit comprising a transmission line coupler having an inner conductor and outer conductor means, a short pick-up wire mounted adjacent and parallel to the inner conductor, two diodes with like electrodes connected to opposite ends of the pick-up wire, and a resistor connected between the other electrodes of the two diodes, so that a meter connected across the resistor indicates the phase condition of an R.F. signal on the transmission line.

2. A phase sensor circuit according to claim 1, wherein said resistor is a carbon type, and wherein said diodes have cathode electrodes connected to the pick-up wire, and anode electrodes connected to the resistor.

* * * * *